(12) United States Patent
Ezaki et al.

(10) Patent No.: US 7,352,615 B2
(45) Date of Patent: Apr. 1, 2008

(54) MAGNETIC MEMORY DEVICE

(75) Inventors: Joichiro Ezaki, Tokyo (JP); Yuji Kakinuma, Tokyo (JP)

(73) Assignee: TDX Corporation, Tokyo (JP)

( * ) Notice: Subject to any disclaimer, the term of this patent is extended or adjusted under 35 U.S.C. 154(b) by 29 days.

(21) Appl. No.: 11/401,852

(22) Filed: Apr. 12, 2006

(65) Prior Publication Data

US 2006/0239065 A1   Oct. 26, 2006

(30) Foreign Application Priority Data

Apr. 13, 2005   (JP) .............................. 2005-115404

(51) Int. Cl.
*G11C 11/00*   (2006.01)
(52) U.S. Cl. ....................... 365/158; 365/148
(58) Field of Classification Search ................. 365/158
See application file for complete search history.

(56) References Cited

U.S. PATENT DOCUMENTS

2004/0114443 A1*   6/2004   Ezaki et al. ................. 365/200
2005/0112805 A1*   5/2005   Goto et al. .................. 438/149

FOREIGN PATENT DOCUMENTS

JP   2004-178623   6/2004

OTHER PUBLICATIONS

English Language Abstract of JP 2004-178623.
U.S. Appl. No. 10/548,830 to Joichiro Ezaki et al., filed Sep. 13, 2005.
U.S. Appl. No. 10/568,808 to Susumu Haratani et al., filed Feb. 21, 2006.

* cited by examiner

*Primary Examiner*—Huan Hoang
*Assistant Examiner*—Anthan T Tran
(74) *Attorney, Agent, or Firm*—Greenblum & Bernstein, P.L.C.

(57) ABSTRACT

A magnetic memory device which can be formed with a further reduced size. The magnetic memory device includes: a plurality of memory cells each including at least one magnetoresistive effect revealing body and arranged along a pair of lines; a plurality of auxiliary write lines arranged so that each memory cell is provided with one auxiliary write line, each auxiliary write line being connected to the pair of lines, for introducing write currents flowing through the pair of lines to the vicinity of the magnetoresistive effect revealing body; and transistors arranged so that one transistor is inserted in each auxiliary write line, for allowing the write current to flow bidirectionally through the auxiliary write line in an operating state of the transistors.

4 Claims, 3 Drawing Sheets

MAGNETIC MEMORY DEVICE

BACKGROUND OF THE INVENTION

1. Field of the Invention

The present invention relates to a magnetic memory device which is provided with memory cells including magnetoresistive effect revealing bodies, and is configured such that information can be recorded thereon and read out therefrom.

2. Description of the Related Art

As the magnetic memory device of the above-mentioned kind, a magnetic memory device is known which is disclosed in Japanese Laid-Open Patent Publication (Kokai) No. 2004-178623. This magnetic memory device is a magnetic random access memory (hereinafter also referred to as "MRAM"), in which a plurality of memory cells including a pair of magnetoresistive effect revealing bodies (magnetoresistive effect elements) and a pair of backflow-preventing diodes are two-dimensionally arranged.

In the magnetic memory device, an X direction current drive circuit as one write circuit included in an X direction current drive circuit group, and a Y direction current drive circuit as one write circuit included in a Y direction current drive circuit group are selected, whereby write currents are supplied to a write word line and a write bit line to which are connected the selected X direction current drive circuit and the selected Y direction current drive circuit, respectively. In this case, the write word line and the write bit line are composed of a pair of lines connected to each other on sides thereof remote from the X direction current drive circuit and the Y direction current drive circuit, whereby they are configured such that the write currents supplied from the respective current drive circuits are turned back on the remote sides for being returned to the respective current drive circuits. As a result, a synthetic magnetic field of the write currents is applied to a memory cell, which is disposed at an intersection of the write word line and the write bit line through which the write currents are flowing, out of the plurality of memory cells included in the memory cell group, whereby one of the pair of magnetoresistive effect revealing bodies in the memory cell assumes a high resistance value, and the other of the pair of magnetoresistive effect revealing bodies assumes a low resistance value, thereby storing one-bit information. In this case, the X direction current drive circuit and the Y direction current drive circuit are configured as illustrated in FIG. 5 of the publication.

On the other hand, in the above magnetic memory device, to read out information stored in one of the plurality of memory cells, a pair of transistors (column-selecting transistors) are operated via a Y direction address decoder shown in FIG. 9 of the publication, thereby making it possible to supply electric currents to a pair of sense bit lines (current supply lines) connected to the emitter terminals of the pair of column-selecting transistors, respectively, via current/voltage converting resistors. Further, if one constant current circuit is operated via an X direction address decoder, it becomes possible to introduce a constant current from a memory cell connected to one sense word line (current introducing line) connected to the constant current circuit. As a result, one memory cell, which is disposed at an intersection of the pair of current supply lines and the current introducing line and is connected to the current supply lines and the current introducing line, is selected, whereby electric currents dependent on the resistance values of the respective magnetoresistive effect revealing bodies flow through a first path from the power source to the ground via one of the current/voltage converting resistors, one of the column-selecting transistors, one of the magnetoresistive effect revealing bodies included in the selected memory cell, one of the backflow-preventing diodes, and the constant current circuit, and a second path from the power source to the ground via the other of the current/voltage converting resistors, the other of the column-selecting transistors, the other of the magnetoresistive effect revealing bodies included in the selected memory cell, the other of the backflow-preventing diodes, and the constant current circuit, respectively. Further, voltages proportional to the current values of electric currents flowing through the first and second paths are generated across opposite ends of the respective current/voltage converting resistors arranged in the paths. Therefore, by detecting voltages (or the difference in the voltages) generated in the respective current/voltage converting resistors, it is possible to detect the magnitudes of the resistance values of the respective magnetoresistive effect revealing bodies included in the selected memory cell, thereby reading out information stored in the memory cell.

SUMMARY OF THE INVENTION

By the way, the inventors have also developed a magnetic memory device including memory cells configured as shown in FIG. 5, based on the above-described conventional magnetic memory device. This magnetic memory device 101 includes only write bit lines 102 formed by a pair of lines 102*a* and 102*b*, as write lines, without including the write word line. Further, in the magnetic memory device 101, memory cells 103 are each comprised of a pair of magnetoresistive effect revealing bodies 2*a* and 2*b*, a pair of backflow-preventing diodes Da and Db, a pair of transistors (NPN bipolar transistors, for example) TRa and TRb, and an auxiliary write line 104. In this case, the auxiliary write line 104 has opposite ends thereof connected to the lines 102*a* and 102*b*, respectively, and is disposed such that a write current flowing through the write bit line 102 is introduced to the vicinity of the magnetoresistive effect revealing bodies 2*a* and 2*b*. Further, the transistors TRa and TRb are inserted in the auxiliary write line 104 in a parallel state in which the collector terminal of one of the transistors is connected to the emitter terminal of the other transistor. Further, a data line Dy and a data line Ry are connected to the base terminals of the transistors TRa and TRb. In this case, the same logic information as information to be stored in the memory cell 103 is output to the data line Dy, and logic information opposite to information to be stored in the memory cell 103 is output to the data line Ry.

In the magnetic memory device 101, to write information on a memory cell 103, the levels of the data lines Dy and Ry are changed such that the levels are opposite to each other (e.g., when one of the levels is "High", the other of the levels is "Low") according to the details of information to be stored in the memory cell 103. Further, the potentials of the lines 102*a* and 102*b* forming one write bit line 102 are changed according to the levels of the data lines Dy and Ry such that the potentials are opposite to each other. More specifically, when information of "1" is written, the data line Dy becomes High, and the data line Ry becomes Low. This means that the line 102*a* has a high potential, and the line 102*b* has a low potential. On the other hand, when information of "0" is written, the data line Dy becomes Low, and the data line Ry becomes High. Therefore, the line 102*a* has a low potential, and the line 102*b* has a high potential. Hence, the direction of a write current flowing through the auxiliary write line 104 is switched according to the details of information to be stored in the memory cell 103, and the directions of magnetic fields generated by write currents applied to the magnetoresistive effect revealing bodies 2a and 2b are also changed. As a result, one of the magnetoresistive effect revealing bodies 2a and 2b assumes a high resistance value, and the other assumes a low resistance value, according to the directions of the magnetic fields, whereby desired information is stored in the memory cell 103. On the other hand, to read out information stored in the memory cell 103, a predetermined voltage is applied to a read word line X. This cause read currents to be supplied from the read word line X to the respective magnetoresistive effect revealing bodies 2a and 2b via the backflow-preventing diodes Da and Db. In this case, the read currents corresponding to the resistance values of the magnetoresistive effect revealing bodies 2a and 2b flow through the magnetoresistive effect revealing bodies 2a and 2b, respectively, to flow into a constant current circuit, not shown, via a pair of lines 105a and 105b forming a read bit line 105. Therefore, by detecting the read currents flowing through the lines 105a and 105b on a read circuit, not shown, it is possible to read out information stored in the memory cell 103.

According to the magnetic memory device 101, in writing information in a memory cell 103, write currents flowing through the lines 102a and 102b forming the write bit line 102 can be turned back by the auxiliary write line 104 where the memory cell 103 into which the information is about to be written is disposed. This makes it possible to dispense with the write word line, thereby making it possible to also dispense with the X direction current drive circuit for supplying an electric current to the write word line. Consequently, it is possible to simplify the construction of the magnetic memory device 101, thereby making it possible to further reduce the size of the magnetic memory device 101.

However, from the further study of the proposed memory cells 103 of the magnetic memory device 101, the present inventors found out the following points to be improved. In the magnetic memory device 101, each memory cell 103 includes two transistors TRa and TRb for use in writing information, and two magnetoresistive effect revealing bodies 2a and 2b for use in reading the information. This complicates the construction of the memory cell 103 itself, thereby making it difficult to further reduce the sizes of the memory cell and the magnetic memory device.

The present invention has been made to solve the problems described above, and a main object thereof is to provide a magnetic memory device capable of being made smaller.

To attain the above object, a magnetic memory device according to the present invention comprises: a plurality of memory cells each including at least one magnetoresistive effect revealing body and arranged side by side along a pair of write lines; a plurality of auxiliary write lines arranged so that each memory cell is provided with one auxiliary write line, each auxiliary write line being connected to the pair of write lines, for introducing write currents flowing through the pair of write lines to the vicinity of the magnetoresistive effect revealing body; and transistors arranged so that one transistor is inserted in each auxiliary write line, for allowing the write currents to flow bidirectionally through the auxiliary write lines in an operating state of the transistors.

According to the magnetic memory device, by comprising: a plurality of auxiliary write lines arranged so that each memory cell is provided with one auxiliary write line, each auxiliary write line being connected to a pair of write lines so as to introduce write currents flowing through the pair of write lines to the vicinity of the magnetoresistive effect revealing body; and transistors arranged so that one transistor is inserted in each auxiliary write line and configured to allow the write currents to flow bidirectionally through the auxiliary write lines in an operating state of the transistors, it is possible to further reduce the size of the memory cells, compared with a memory cell including two transistors which the present inventors have already developed. This makes it possible to reduce the size of the whole magnetic memory device as well.

In this case, each memory cell has one magnetoresistive effect revealing body, and the transistors which are each composed of a multi-emitter type bipolar transistor including two emitter terminals and are each configured such that a collector terminal and a first emitter terminal are connected to the respective auxiliary write lines, whereby the transistors are arranged so that one transistor is inserted in each auxiliary write line, with a second emitter terminal being connected to the magnetoresistive effect revealing body.

With this construction, it is possible to supply a read current flowing from a base terminal of the multi-emitter type bipolar transistor to the magnetoresistive effect revealing body connected to the second emitter terminal. Therefore, it is possible to simplify the construction of each memory cell, compared with a memory cell configured to have a transistor and a backflow-preventing diode for supplying a read current to a magnetoresistive effect revealing body. Therefore, it is possible to manufacture the magnetic memory device at lower costs.

Further, the memory cells have a pair of magnetoresistive effect revealing bodies and configured to store one-bit information based on whether or not one of the pair of magnetoresistive effect revealing bodies has a resistance value larger than that of the other of the pair of magnetoresistive effect revealing bodies, and each transistor is composed of a multi-emitter type bipolar transistor including three emitter terminals, and is configured such that a collector terminal and a first emitter terminal are connected to the respective auxiliary write lines, whereby the transistors are arranged so that one transistor is inserted in each auxiliary write line, with a second emitter terminal being connected to one of the pair of magnetoresistive effect revealing bodies, and a third emitter terminal being connected to the other of the pair of magnetoresistive effect revealing bodies.

With this construction, it is possible to supply a read current flowing from a base terminal of the multi-emitter type bipolar transistor to the magnetoresistive effect revealing bodies connected to the second and third emitter terminals. Therefore, it is possible to simplify the construction of each memory cell, compared with a memory cell configured to have two transistors and two backflow-preventing diodes for supplying a read current to a pair of magnetoresistive effect revealing bodies. Therefore, it is possible to manufacture the magnetic memory device at lower costs.

Further, the transistors are formed on a P-type semiconductor substrate to have an NPN structure, and an N-type semiconductor layer as a collector layer disposed toward the P-type semiconductor substrate of the NPN structure and the P-type semiconductor substrate are highly insulated from each other. With this construction, it is possible to suppress occurrence of latch-up.

It should be noted that the present disclosure relates to the subject matter included in Japanese Patent Application No. 2005-115404 filed Apr. 13, 2005, and it is apparent that all the disclosures therein are incorporated herein by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Hereinafter, an embodiment of the present invention will be described in detail with reference to the drawings.

First of all, the construction of a magnetic memory device M according to the present embodiment will be described with reference to FIGS. 1 and 2.

Figure 1:
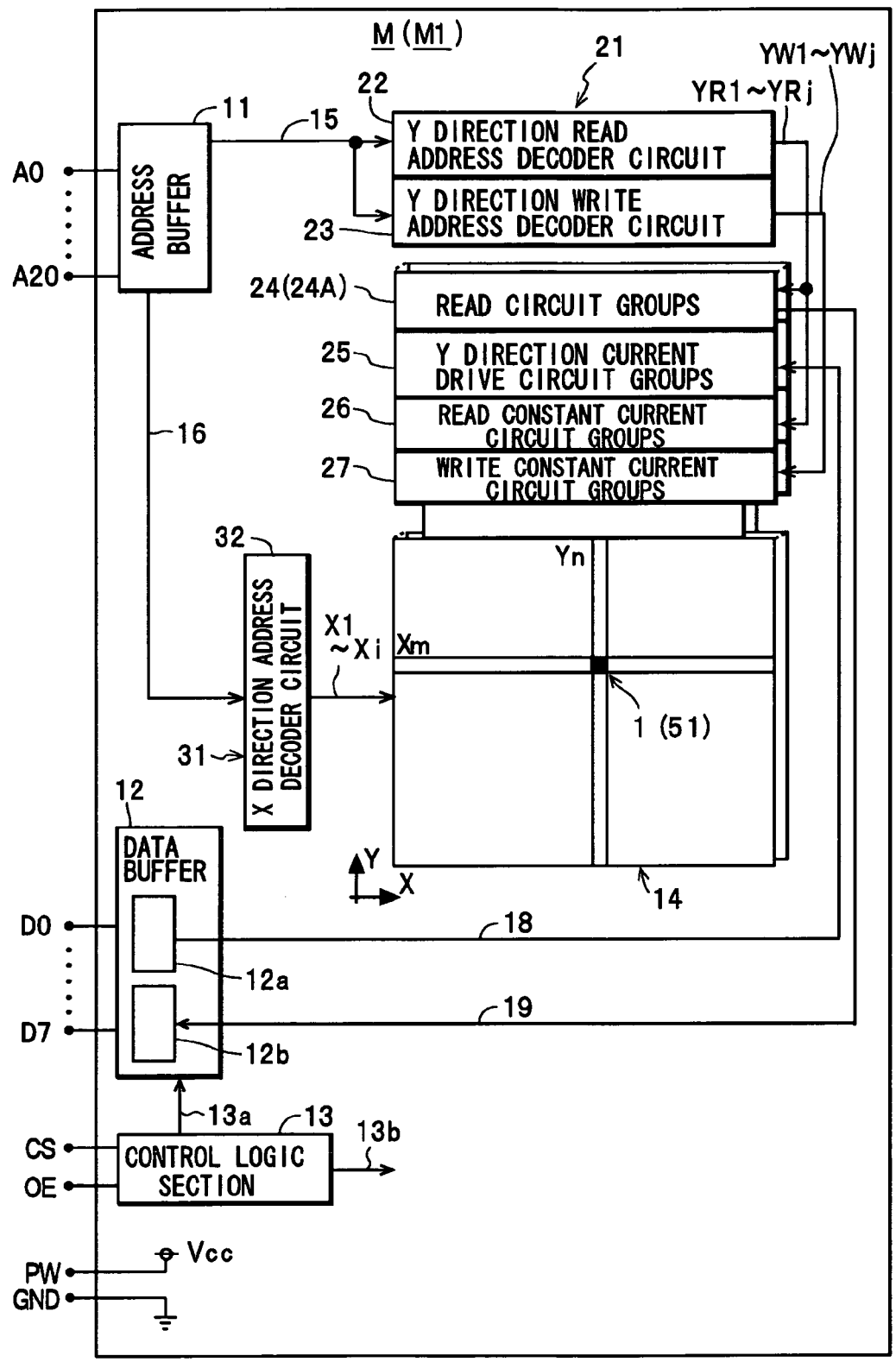
FIG. 1 is a block diagram showing the whole arrangement of a magnetic memory device.

As shown in FIG. 1, the magnetic memory device M is comprised of an address buffer 11, a data buffer 12, a control logic section 13, memory cell groups 14, a Y direction drive control circuit section 21, and an X direction drive control circuit section 31. In this case, the Y direction drive control circuit section 21 includes a Y direction read address decoder circuit 22, a Y direction write address decoder circuit 23, read circuit groups 24, Y direction current drive circuit groups 25, read constant current circuit groups 26, and write constant current circuit groups 27. On the other hand, the X direction drive control circuit section 31 has an X direction address decoder circuit 32. Further, as to the memory cell groups 14, the read circuit groups 24, the Y direction current drive circuit groups 25, the read constant current circuit groups 26, and the write constant current circuit groups 27, the magnetic memory device M is provided with the same number of groups as the number of bits (e.g., 8 bits, in the illustrated example) of data (data input via the data buffer 12). Further, the magnetic memory device M is configured such that in storing predetermined data in a predetermined address specified by an address input via the address buffer 11, information (1 or 0) of bits constituting the predetermined data is stored in a memory cell 1 having the predetermined address in each memory cell group 14 corresponding to the respective bits. Further, the component elements of the magnetic memory device M are operated by a DC voltage Vcc supplied between a power terminal PW and a ground terminal GND from a DC voltage source.

The address buffer 11 includes external address input terminals A0 to A20, and delivers address signals (e.g., the more-significant signal of address signals) received via the external address input terminals A0 to A20 to the Y direction read address decoder circuit 22 via a Y direction address bus 15, while delivering the address signals (e.g., the less-significant signal of the address signals) received via the external address input terminals A0 to A20 to the X direction address decoder circuit 32 via an X direction address bus 16.

The data buffer 12 includes external data terminals D0 to D7, an input buffer 12a, and an output buffer 12b. Further, the data buffer 12 is connected to the control logic section 13 via a control signal line 13a. In this case, the input buffer 12a is connected to each of the Y direction current drive circuit groups 25 via a Y direction write data bus 18. Further, to store information of bits included in data input via the external data terminals D0 to D7 in the respective eight memory cell groups 14 each corresponding the respective bits, the input buffer 12a outputs the same logic information as the bit information, and logic information opposite to the bit information to the Y direction current drive circuit groups 25 corresponding to the respective bits.

Figure 2:
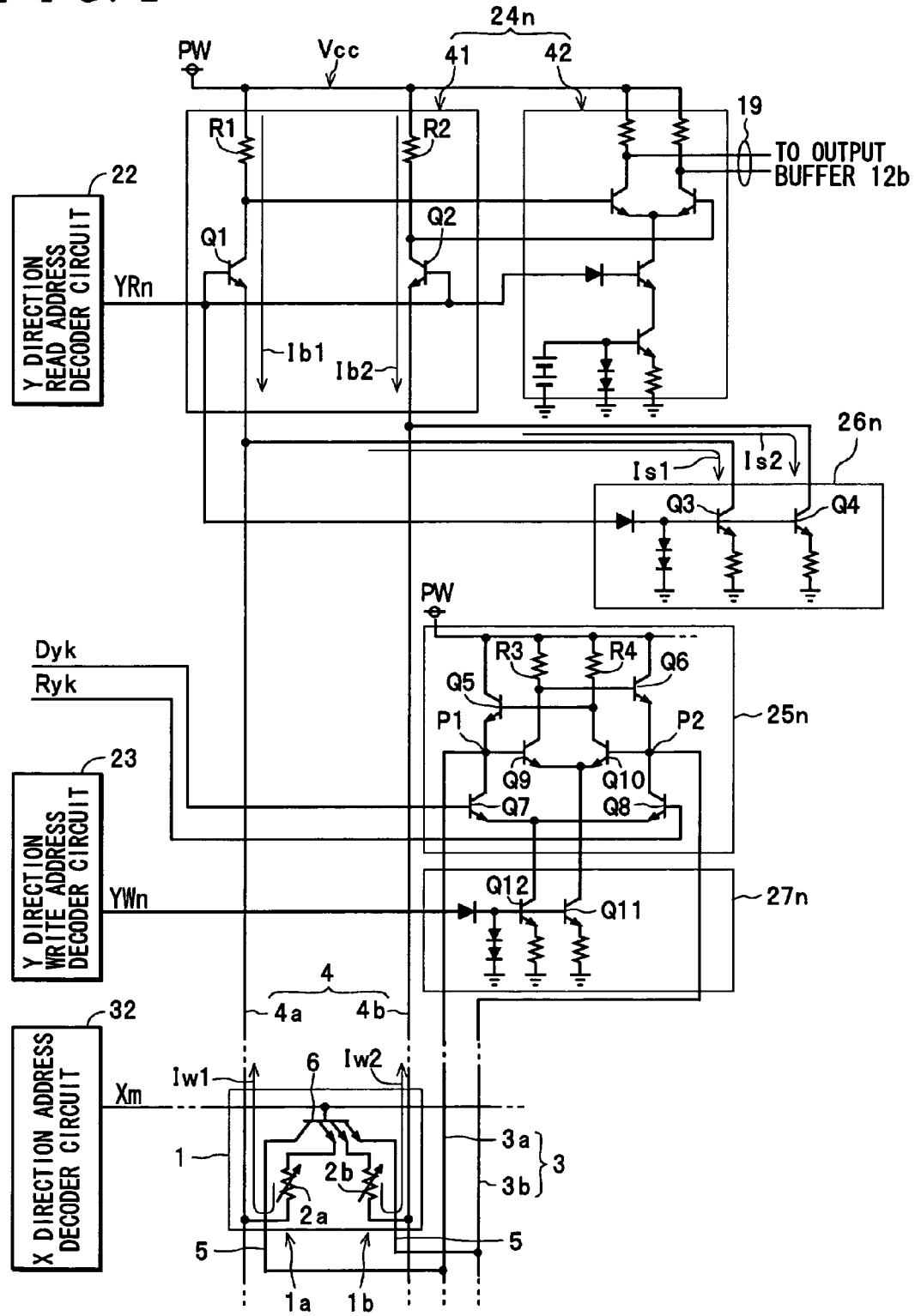
FIG. 2 is a circuit diagram showing the arrangement of a memory cell, a Y direction current drive circuit, a write constant current circuit, a read circuit, a read constant current circuit, a write bit line, and a read bit line.

More specifically, as shown in FIG. 2, the input buffer 12a outputs the same logic information as information input via the external data terminal Dk (k represents an integer of 0 to 7) (hereinafter referred to as "k-th bit information" in the illustrated example) via a data line Dyk of the Y direction write data bus 18, and logic information opposite to the k-th bit information via a data line Ryk of the Y direction write data bus 18, to a Y direction current drive circuit group 25 connected to a memory cell group 14k where the k-th bit information is to be stored. On the other hand, the output buffer 12b is connected to the read circuit groups 24 of the memory cell group 14k via a Y direction read data bus 19. Further, the output buffer 12b inputs information of bits read out by the read circuit groups 24 of the memory cell group 14k, via the Y direction read data bus 19, and outputs the input data to the external data terminals D0 to D7. Further, the input buffer 12a and the output buffer 12b operate according to control signals input from the control logic section 13 via a control signal line 13a.

The control logic section 13 includes an input terminal CS and an input terminal OE, and controls the operations of the data buffer 12, the Y direction read address decoder circuit 22, the Y direction write address decoder circuit 23, and the read circuit groups 24. More specifically, the control logic section 13 determines which of the input buffer 12a and the output buffer 12b should be made active, based on a chip select signal input via the input terminal CS and an output enable signal input via the input terminal OE, generates a control signal for causing the input buffer 12a or the output buffer 12b to operate according to the determination, and delivers the control signal to the data buffer 12 via the control signal line 13a. Further, the control logic section 13 determines which of the Y direction read address decoder circuit 22 and the Y direction write address decoder circuit 23 should be made active, based on the chip select signal and the output enable signal, generates a control signal for causing the Y direction address decoder circuits 22 or 23 to operate according to the determination, and delivers the control signal to the Y direction address decoder circuits 22 or 23 via a control signal line 13b.

Referring to FIG. 2, each memory cell group 14 is comprised of: a plurality (a number hereinafter referred to as j: j is an integer equal to or larger than 2) of write bit lines 3, each of which is formed by a pair of lines 3a and 3b (corresponding to write lines in the present invention; see FIG. 2) arranged parallel with each other, and which are arranged parallel to each other along the X direction as viewed in FIG. 1; a plurality (j) of read bit lines 4, each of which is formed by a pair of lines 4a and 4b arranged parallel to each other, and which are arranged parallel to the write bit lines 3, respectively; a plurality (a number hereinafter referred to as i: i is an integer equal to or larger than 2) of word decode lines X (shown as Xm in FIG. 2) which intersect the write bit lines 3 and the read bit lines 4 and are arranged parallel to each other along the Y direction as viewed in FIG. 1; a plurality (i×j) of memory cells (magnetic memory cells) 1 which are two-dimensionally arrayed (e.g., in the form of a matrix composed of i rows and j columns) by being arranged at respective intersections where the write bit lines 3 and the word decode lines X intersect with each other; and a plurality of auxiliary write lines 5 which are arranged so that each memory cell 1 is provided with one auxiliary write line. In this case, each auxiliary write line 5 has opposite ends thereof connected to the pair of lines 3a and 3b of the write bit line 3, respectively, and is disposed such that a write current flowing through the write bit line 3 can be introduced to the vicinity of a pair of magnetoresistive effect revealing bodies, described hereinafter, arranged within each memory cell 1. It should be noted that in FIG. 2, for ease of understanding of description, only one memory cell 1 disposed at a location on an m-th row and an n-th column of the matrix, and component elements associated with the memory cell 1 are shown, by way of example. In the illustrated example, m designates an integer defined as $1 \leq m \leq i$, and n designates an integer defined as $1 \leq n \leq j$. Hereinafter, the memory cell 1 and the configuration related thereto will be described by taking a memory cell 1 disposed at the location on the m-th row and the n-th column of the matrix, and the component elements associated therewith as an example.

As shown in FIG. 2, the memory cell 1 is comprised of a pair of memory elements 1a and 1b, and a transistor 6. In this case, the memory elements 1a and 1b include magnetoresistive effect revealing bodies 2a and 2b constructed by using a GMR (Giant Magneto-Resistive) or a TMR (Tunneling Magneto-Resistive), respectively. The transistor 6 is formed by a multi-emitter type (NPN) bipolar transistor including three emitter terminals, by way of example. The magnetoresistive effect revealing body 2a is connected between the second emitter terminal of the transistor 6 and one line 4a of the read bit line 4 on the n-th column, and the magnetoresistive effect revealing body 2b is connected between the third emitter terminal of the transistor 6, and the other line 4b of the read bit line 4 on the n-th column. Further, the base terminal of the transistor 6 is connected to the word decode line Xm on the m-th row. Further, the transistor 6 is inserted in the auxiliary write line 5 in a state where a collector terminal and a first emitter terminal of the transistor are directly connected to the auxiliary write lines 5, respectively. When the transistor 6 is operating, the memory cell 1 is shifted depending on the direction of a magnetic field generated by a write current flowing from the write bit line 3 to the auxiliary write line 5, between a state in which the resistance value of the magnetoresistive effect revealing body 2a in the memory element 1a is smaller than that of the magnetoresistive effect revealing body 2b in the memory element 1b, and a state in which the resistance value of the magnetoresistive effect revealing body 2a in the memory element 1a is larger than that of the magnetoresistive effect revealing body 2b in the memory element 1b. Thus, the information of bits constituting data are stored.

Figure 3:
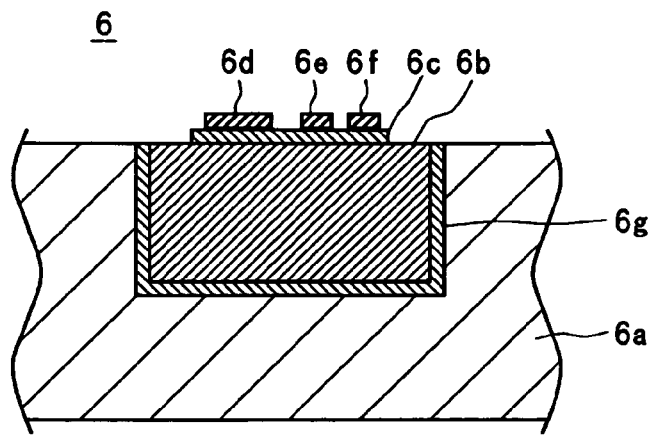
FIG. 3 is a cross-sectional view of a transistor disposed in the FIG. 2 memory cell.

Further, the transistor 6 used in the illustrated example has a current amplification factor (so-called forward β) in the forward direction (direction from the collector terminal toward the emitter terminal) and a current amplification factor (so-called reverse β) in the reverse direction (direction from the emitter terminal toward the collector terminal) which are both equal to or larger than a predetermined value. Therefore, the transistor 6 is configured so that it can allow a write current having a sufficient current value to flow bidirectionally between the collector terminal and the emitter terminal when in operation. More specifically, the transistor 6 is configured such that it allows a write current to flow in the forward direction when the collector terminal has higher potential than that of the emitter terminal, whereas when the emitter terminal has higher potential than that of the collector terminal, it allows a write current to flow in the reverse direction. Further, e.g., as shown in FIG. 3, the transistor 6 is configured to have an NPN structure comprised of an N-type semiconductor layer (collector layer in the present invention) 6b functioning as a collector terminal, a P-type semiconductor layer 6c functioning as a base terminal, and an N-type semiconductor layer (comprised of N-type semiconductor layers 6d, 6e, 6f functioning as first, second, and third emitter terminals, respectively) which are deposited on a P-type semiconductor substrate 6a in the mentioned order. Further, the transistor 6 has an insulating layer 6g formed between the N-type semiconductor layer 6b and the P-type semiconductor substrate 6a such that the N-type semiconductor layer 6b and the P-type semiconductor substrate 6a are highly insulated from each other, to thereby suppress occurrence of latch-up. It should be noted that as shown in FIG. 3, the transistor 6 is configured such that a contact area at which the N-type semiconductor layer 6d functioning as the first emitter terminal is in contact with the P-type semiconductor layer 6c is made larger than a contact area at which the other N-type semiconductor layers 6e and 6f are in contact with the P-type semiconductor layer 6c, whereby a write current having a sufficient amount of an electric current can be supplied. Further, although in FIG. 3, the transistor 6 is configured to have a vertical type structure, by way of example, it can also be configured to have a lateral type structure.

When the control signal is being input via the control signal line 13b, the Y direction read address decoder circuit 22 of the Y direction drive control circuit section 21 selects one (read bit decode line YRn) of j read bit decode lines YR1, . . . , YRn, . . . , and YRj connected to j read circuits included in the read circuit groups 24, and j read constant current circuits included in the read constant current circuit groups 26, respectively, based on address signals input via the Y direction address bus 15, and supplies (applies) a predetermined voltage to the selected read bit decode line YRn. In this case, a read circuit 24n (see FIG. 2) of the j read circuits included in the read circuit groups 24, which is connected to the read bit decode line YRn, and a read constant current circuit 26n of the j read constant current circuits included in the read constant current circuit groups 26, which is connected to the read bit decode line YRn, operate when the predetermined voltage is being supplied via the read bit decode line YRn.

As shown in FIG. 2, each read circuit (the read circuit 24n will be described by way of example) is comprised of a pre-stage circuit (current supply circuit) 41, and a post-stage circuit (differential amplifier circuit) 42. The read circuit supplies electric currents Ib1 and Ib2 to the respective lines 4a and 4b of the read bit lines 4 connected to i memory cells 1 included in the n-th column of the memory cell group 14, and detects the difference between the electric currents Ib1 and Ib2 to thereby enable information to be read out from the memory cells 1. More specifically, the pre-stage circuit 41 is comprised of current/voltage converting resistances R1 and R2, and two transistors (e.g., NPN transistors) Q1 and Q2, and supplies the electric currents Ib1 and Ib2 to the lines 4a and 4b when in operation. As shown in FIG. 2, the post-stage circuit 42 is constructed as a differential amplifier circuit, and when in operation, detects the difference value between the electric currents Ib1 and Ib2, more specifically, detects and amplifies the potential difference between voltages generated by the electric currents Ib1 and Ib2 across the opposite ends of each of the resistances R1 and R2. When the predetermined voltage is being supplied from the read bit decode line YRn selected by the Y direction read address decoder circuit 22, the pre-stage circuit 41 and the post-stage circuit 42 operate to shift the read circuit 24n to its operating state.

Referring to FIG. 2, each read constant current circuit (the read constant current circuit 26n will be described by way of example) includes a pair of transistors Q3 and Q4, whose emitter terminals are grounded via resistances (having the same resistance value), and is configured such that constant currents Is1 and Is2 having the same current value are introduced when the predetermined voltage is supplied to the base terminals of the transistors Q3 and Q4 through the read bit decode line YRn. In this case, as shown in FIG. 2, the electric current Is1 flowing through the transistor Q3 becomes the total current of: the electric current Ib1 supplied to the line 4a, i.e., one of the lines 4a and 4b of the read bit line 4 via the transistor Q1 of the pre-stage circuit 41; and an electric current Iw1 supplied to the line 4a of the read bit line 4 from the selected word decode line Xm via the transistor 6 (the base terminal and the second emitter terminal thereof) and the magnetoresistive effect revealing body 2a within the memory cell 1. Similarly, the electric current Is2 flowing through the transistor Q3 becomes the total current of: the electric current Ib2 supplied to the line 4b, i.e., the other of the lines 4a and 4b of the read bit line 4 via the transistor Q2 of the pre-stage circuit 41; and an electric current Iw2 supplied to the other line 4b of the read bit line 4 from the selected word decode line Xm via the transistor 6 (the base terminal and the third emitter terminal thereof) and the magnetoresistive effect revealing body 2b within the memory cell 1. With this configuration, the total current value (total value) of the electric current Ib1 and the electric current Iw1, and the total current value (total value) of the electric current Ib2 and the electric current Iw2 are controlled by the read constant current circuit 26n such that the total current values become constant.

Further, the Y direction write address decoder circuit 23 of the Y direction drive control circuit section 21 selects one (write bit decode line YWn) of j write bit decode lines YW1, ..., YWn, ..., and YWj connected to j write constant current circuits included in the write constant current circuit groups 27, respectively, based on address signals input via the Y direction address bus 15, and applies a predetermined voltage to the selected write bit decode line YWn when the control signal is being input via the control signal line 13b. In this case, a write constant current circuit 27n (see FIG. 2) of the j write constant current circuits included in the write constant current circuit groups 27, which is connected to the write bit decode line Ywn, is operated by the predetermined voltage applied via the write bit decode line YWn, to thereby make operable a Y direction current drive circuit 25n of the j Y direction current drive circuits included in the Y direction current drive circuit groups 25, which is connected to the write constant current circuit 27n.

As shown in FIG. 2, the Y direction current drive circuit 25n is comprised of transistors Q5 to Q10 and resistances R3 and R4. Further, as shown in FIG. 2, the write constant current circuit 27n includes a pair of transistors Q11 and Q12, whose emitter terminals are grounded via resistances, respectively, and is configured such that a predetermined electric current is introduced from the Y direction current drive circuit 25n when the predetermined voltage is applied via the write bit decode line YWn. When the write constant current circuit 27n is operating, the Y direction current drive circuit 25n shifts the transistor Q5 and the transistor Q8 to the same ON/OFF states approximately at the same time, and shifts the transistor Q6 and the transistor Q7 to ON/OFF states different from the ON/OFF states of the transistors Q5 and Q8 approximately at the same time, depending on the details of information output to the data lines Dyk and Ryk connected to the base terminals of the transistors Q7 and Q8. This causes the Y direction current drive circuit 25n to shift the potential of one of connection points P1 and P2, to which are connected the lines 3a and 3b forming the write bit line 3 on the n-th column, to a high potential, while shifting the potential of the other of the connection points P1 and P2 to a low potential, depending on the details of information output to the data lines Dyk and Ryk.

The X direction address decoder circuit 32 of the X direction drive control circuit section 31 selects one (word decode line Xm) of i word decode lines X1, ..., Xm, ..., and Xi based on the address signals input via the X direction address bus 16, and supplies (applies) a predetermined voltage to the selected word decode line Xm.

Next, a description will be given of an information write operation of the magnetic memory device M.

First, the address buffer 11 delivers address signals input via the external address input terminals A0 to A20, to the Y direction read address decoder circuit 22 and the Y direction write address decoder circuit 23 via the Y direction address bus 15, and to the X direction address decoder circuit 32 via the X direction address bus 16. At this time, the Y direction write address decoder circuit 23 is shifted to its operating state in response to the control signal input from the control signal line 13b of the control logic section 13, to select one (e.g., the write bit decode line YWn) of the write bit decode lines YW1 to YWj based on the input address signals. On the other hand, the Y direction read address decoder circuit 22 is held in its non-operating state. The X direction address decoder circuit 32 selects one (e.g., the word decode line Xm) of the word decode lines X1 to Xi based on the input address signals. The input buffer 12a outputs the information of respective bits included in data input from the external data terminals D0 to D7, to the Y direction current drive circuit groups 25 of the memory cell groups 14, corresponding to the respective bits, via the Y direction write data bus 18. On the other hand, the output buffer 12b is held in its non-operating state by the control signal delivered from the control signal line 13a of the control logic section 13.

Then, the write constant current circuit 27n of each memory cell group 14, selected by the write bit decode line Ywn, operates to thereby shift the Y direction current drive circuit 25n to its operating state. In this case, the Y direction current drive circuit 25n shifts the potential of one of the connection points P1 and P2, to which are connected the lines 3a and 3b forming the write bit line 3 on the n-th column of each memory cell group 14, to a high potential, while shifting the potential of the other of the connection points P1 and P2 to a low potential, according to the details of information output to the data lines Dyk and Ryk. On the other hand, when a predetermined voltage is supplied to the base terminals of the transistors 6 of the memory cells 1 on the m-th row of the memory cell groups 14, which are selected by the word decode line Xm, the selected transistors 6 are shifted to their ON state. This places each transistor 6 in a state where the collector terminal and the first emitter terminal thereof can be bidirectionally electrically continuous therebetween, so that the lines 3a and 3b of the write bit line 3 are short-circuited by the auxiliary write lines 5 arranged in the vicinity of each memory cell 1 on the m-th row of each memory cell group 14. As a result, a write current in a direction dependent on the details of information output to the data lines Dyk and Ryk flows from the write bit line 3 on the n-th column of each memory cell group 14, to each auxiliary write line 5 arranged in the vicinity of each memory cell 1 on the m-th row of each memory cell group 14. Therefore, the resistance values of the magnetoresistive effect revealing bodies 2a and 2b of each memory cell 1 disposed in the vicinity of the auxiliary write line 5 through which the write current flow, that is, the resistance values of the magnetoresistive effect revealing bodies 2a and 2b of each memory cell 1 disposed on the m-th row and the n-th column of each memory cell group 14, are changed according to the direction of a magnetic field caused by the write current flowing through the auxiliary write lines 5, whereby the information of bits included in input data are stored in each memory cell 1 disposed on the m-th row and the n-th column of each memory cell group 14.

Next, a description will be given of an information read operation of the magnetic memory device M.

First, the address buffer 11 delivers address signals input via the external address input terminals A0 to A20 to the Y direction read address decoder circuit 22 and the Y direction write address decoder circuit 23 via the Y direction address bus 15, while delivering the address signals input via the external address input terminals A0 to A20 to the X direction address decoder circuit 32 via the X direction address bus 16. At this time, the Y direction read address decoder circuit 22 is shifted to its operating state in response to the control signal input from the control signal line 13b of the control logic section 13, to select one (e.g., the read bit decode line YRn) of the read bit decode lines YR1 to YRj based on the input address signals. On the other hand, the Y direction write address decoder circuit 23 is held in its non-operating state. The X direction address decoder circuit 32 selects one (e.g., the word decode line Xm) of the word decode lines X1 to Xi based on the input address signals. In the data buffer 12, the output buffer 12b is shifted to its operating state in response to the control signal input from the control signal line 13a, and the input buffer 12a is shifted to its non-operating state.

In this case, in the read circuit 24n of each memory cell group 14 selected by the read bit decode line YRn, a predetermined voltage is supplied (applied) via the read bit decode line YRn, whereby the pre-stage circuit 41 and the post-stage circuit 42 are shifted to their operating states. Further, the read constant current circuit 26n of each memory cell group 14, selected by the read bit decode line YRn is also shifted to its operating state. On the other hand, a predetermined voltage is supplied (applied) to the base terminal of each transistor 6 (transistor 6 in each memory cell 1 located on the m-th row of each memory cell group 14) selected by the word decode line Xm, whereby the transistor 6 is shifted to a state (ON state) in which the potential of the base terminal is higher than those of the first to third emitter terminals. As a result, as shown in FIG. 2, the electric currents Iw1 and Iw2 start to be supplied from the word decode line Xm to the memory elements 1a and 1b via the base terminal and the second and third emitter terminals of the transistor 6. In this case, one of the magnetoresistive effect revealing bodies 2a and 2b included in each memory cell 1 located on the m-th row and the n-th column of each memory cell group 14 is in a state of high resistance, and the other is in a state of low resistance, depending on bit information stored in the memory cell 1. Consequently, the current values of the electric currents Iw1 and Iw2 flowing through the memory elements 1a and 1b are dependent on the bit information stored in the memory cell 1. Further, the electric current Is1 as the total current of the electric current Ib1 and the electric current Iw1, and the electric current Is2 as the total current of the electric current Ib2 and the electric current Iw2, are controlled by the read constant current circuit 26n such that they become constant. Further, although as described above, the transistor 6 is shifted to the ON state during the read operation, the write constant current circuit 27n and the Y direction current drive circuit 25n are held in their non-operating states, and hence the connection points P1 and P2, to which are connected the lines 3a and 3b of the write bit line 3 on the n-th column of each memory cell group 14, are held at approximately the same potential. This inhibits a write current from flowing between the first emitter terminal and the collector terminal of the transistor 6, and through the auxiliary write lines 5. Therefore, the current values of the electric currents Ib1 and Ib2 become equal to current values obtained by subtracting the electric currents Iw1 and Iw2 from the electric currents Is1 and Is2, which are constant and identical current values, respectively.

The post-stage circuit 42 of the read circuit 24n detects the voltage difference between voltages generated by the electric currents Ib1 and Ib2 across the opposite ends of each of the resistances R1 and R2 (equivalent to the difference between the electric currents Ib1 and Ib2, and hence the difference between the electric currents Iw1 and Iw2), to thereby obtain information (binary information) stored in the memory cell 1, and output the information to the Y direction read data bus 19. Then, the output buffer 12b outputs data input via the Y direction read data bus 19, to the external data terminals D0 to D7. This completes reading of data stored in the memory cell 1.

As described hereinabove, according to the magnetic memory device M, each memory cell 1 is provided with: one auxiliary write line 5 connected to a pair of lines 3a and 3b forming a write bit line 3, so as to introduce a write current flowing through the pair of lines 3a and 3b to the vicinity of the magnetoresistive effect revealing bodies 2a and 2b; and a transistor 6 which is inserted in each auxiliary write line 5 and allows the write current to flow bidirectionally through the auxiliary write line 5 in an operating state thereof. This makes it possible to reduce the size of the memory cell 1, compared with a memory cell including two transistors which the present inventors have already developed. This makes it possible to reduce the size of the whole magnetic memory device M as well.

Further, the transistor 6 is formed by a multi-emitter type transistor having the first to third emitter terminals, and is inserted in the auxiliary write line 5 by connecting the collector terminal and the first emitter terminal thereto, with the second emitter terminal being connected to the magnetoresistive effect revealing body 2a and the third emitter terminal being connected to the magnetoresistive effect revealing body 2b, so as to cause a read current flowing in from the base terminal to be supplied to the magnetoresistive effect revealing bodies 2a and 2b. This makes it possible to further simplify the construction of each memory cell 1, compared with a memory cell configured to have two transistors and two backflow-preventing diodes for supplying a read current to the magnetoresistive effect revealing bodies 2a and 2b, developed by the present inventors. This enables the magnetic memory device M to be manufactured at lower costs.

Furthermore, the transistor 6 is formed on the P-type semiconductor substrate 6a such that it has an NPN structure, and the insulating layer 6g is formed between the N-type semiconductor layer 6b functioning as a collector terminal disposed toward the P-type semiconductor substrate 6a and the P-type semiconductor substrate 6a to highly insulate the N-type semiconductor layer 6b and the P-type semiconductor substrate 6a from each other, whereby it is possible to suppress occurrence of latch-up.

Figure 4:
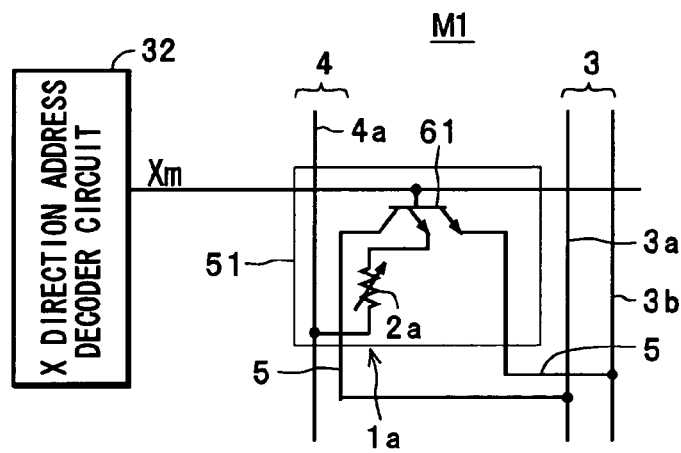
FIG. 4 is a circuit diagram showing the arrangement of another memory cell.
Figure 5:
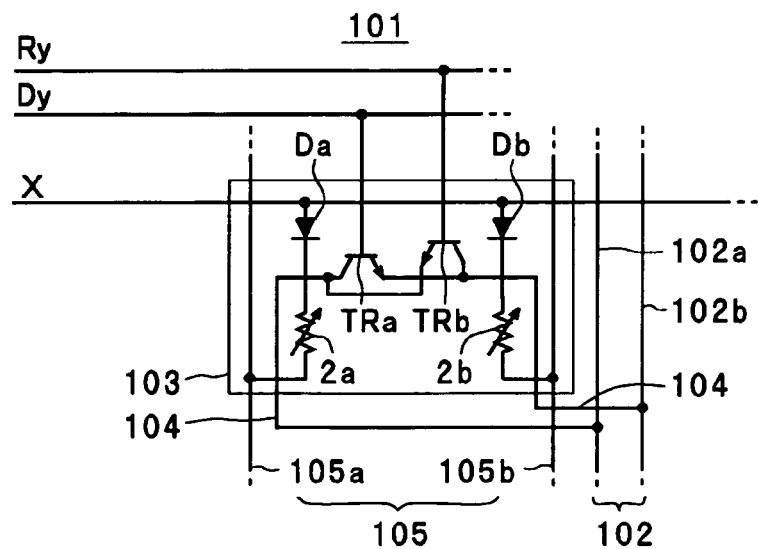
FIG. 5 is a circuit diagram showing the arrangement of a magnetic memory device developed by the present inventors.

It should be noted that the present invention is by no means limited to the aforementioned configuration. For example, as shown in FIG. 4, the present invention can also be applied to a memory cell 51 which includes a memory element 1a having one magnetoresistive effect revealing body 2a. In this memory cell 51, a transistor 61 having two emitter terminals is used, and is inserted in the auxiliary write line 5 by connecting the collector terminal and the first emitter terminal thereof to the auxiliary write line 5, with the second emitter terminal being connected to the magnetoresistive effect revealing body 2a. A magnetic memory device M1 using the above memory cells 51 has a construction almost the same as that of the above-described magnetic memory device M but distinguished therefrom only in the following point: First, the read bit line 4 is formed by one line 4a to which the magnetoresistive effect revealing body 2a is connected. Further, the pre-stage circuit of each read circuit forming read circuit groups 24A is formed only by a circuit on the side of the transistor Q1 of the pre-stage circuit 41 according to the construction of the read bit line 4. It should be noted that the other components are similar to those of the above-described magnetic memory device M, and therefore component elements identical in construction to those of the magnetic memory device M are designated by identical reference numerals and duplicate description thereof is omitted. In this construction as well, each memory cell 51 can be further simplified in construction than the memory cell having the transistors and the backflow-preventing diodes for supplying a read current to the magnetoresistive effect revealing body, whereby it is possible to manufacture the magnetic memory device M1 at lower costs.

Further, the memory cells 1 and 51 can also be configured to have the auxiliary write lines 5 arranged therein. Further, although in the above construction, the number of the emitter terminals of the transistor 6 or 61 is made equal to a number obtained by adding one to the number of the magnetoresistive effect revealing bodies (2a, or 2a and 2b) to connect one emitter terminal to each of the magnetoresistive effect revealing bodies and the auxiliary write lines 5, this is not limited, but is it also possible to employ a transistor having a larger number of emitter terminals as the transistors 6 and 61. In this case, a construction in which a plurality of emitter terminals are connected to the magnetoresistive effect revealing bodies and the auxiliary write lines 5 may be employed, or a construction in which remaining emitter terminals are held in their open state.

What is claimed is:

1. A magnetic memory device, comprising:
  a plurality of memory cells each including one magnetoresistive effect revealing body and arranged side by side along a pair of write lines;
  a plurality of auxiliary write lines arranged so that each memory cell is provided with one auxiliary write line, each auxiliary write line being connected to the pair of write lines to introduce write currents flowing through the pair of write lines to a vicinity of the magnetoresistive effect revealing body; and
  transistors arranged so that one transistor is inserted in each auxiliary write line, to allow the write currents to flow bidirectionally through the auxiliary write lines in an operating state of the transistors,
  wherein the transistors are each composed of a multi-emitter type bipolar transistor including first and second emitter terminals, each transistor being configured such that a collector terminal and the first emitter terminal are connected to the respective auxiliary write lines, and the second emitter terminal is connected to the magnetoresistive effect revealing body.

2. A magnetic memory device, comprising:
  a plurality of memory cells each including a pair of magnetoresistive effect revealing bodies and arranged side by side along a pair of write lines;
  a plurality of auxiliary write lines arranged so that each memory cell is provided with one auxiliary write line, each auxiliary write line being connected to the pair of write lines to introduce write currents flowing through the pair of write lines to a vicinity of the pair of magnetoresistive effect revealing bodies; and
  transistors arranged so that one transistor is inserted in each auxiliary write line, to allow the write currents to flow bidirectionally through the auxiliary write lines in an operating state of the transistors,
  wherein each memory cell is configured to store one-bit information based on whether one of the pair of magnetoresistive effect revealing bodies has a resistance value larger than that of the other of the pair of magnetoresistive effect revealing bodies; and
  the transistors are each composed of a multi-emitter type bipolar transistor including first, second and third emitter terminals, each transistor being configured such that a collector terminal and the first emitter terminal are connected to the respective auxiliary write lines, the second emitter terminal is connected to one of the pair of magnetoresistive effect revealing bodies, and the third emitter terminal is connected to the other of the pair of magnetoresistive effect revealing bodies.

3. A magnetic memory device according to claim 1, wherein the transistors are formed on a P-type semiconductor substrate to have an NPN structure, and an N-type semiconductor layer as a collector layer disposed toward the P-type semiconductor substrate of the NPN structure and the P-type semiconductor substrate are highly insulated from each other.

4. A magnetic memory device according to claim 2, wherein the transistors are formed on a P-type semiconductor substrate to have an NPN structure, and an N-type semiconductor layer as a collector layer disposed toward the P-type semiconductor substrate of the NPN structure and the P-type semiconductor substrate are highly insulated from each other.

* * * * *

UNITED STATES PATENT AND TRADEMARK OFFICE
CERTIFICATE OF CORRECTION

PATENT NO.        : 7,352,615 B2                                    Page 1 of 1
APPLICATION NO.   : 11/401852
DATED             : April 1, 2008
INVENTOR(S)       : Joichiro Ezaki et al.

It is certified that error appears in the above-identified patent and that said Letters Patent is hereby corrected as shown below:

On the title page in item (56) References Cited under
U.S. Patent Documents, please add the following reference: -- 2005/0112808
Shibib et al. --.

Signed and Sealed this

Eighteenth Day of May, 2010

David J. Kappos
*Director of the United States Patent and Trademark Office*